United States Patent
Wu

(10) Patent No.: US 7,206,225 B2
(45) Date of Patent: Apr. 17, 2007

(54) METHOD OF DYNAMICALLY CONTROLLING PROGRAM VERIFY LEVELS IN MULTILEVEL MEMORY CELLS

(75) Inventor: Chao I Wu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 138 days.

(21) Appl. No.: 11/043,854

(22) Filed: Jan. 25, 2005

(65) Prior Publication Data

US 2006/0164884 A1   Jul. 27, 2006

(51) Int. Cl.
*G11C 16/04* (2006.01)
(52) U.S. Cl. ............................. 365/185.03; 365/185.22
(58) Field of Classification Search ........... 365/185.03, 365/185.22
See application file for complete search history.

(56) References Cited

U.S. PATENT DOCUMENTS

| 6,219,276 | B1 | 4/2001 | Parker |
| 6,292,394 | B1 | 9/2001 | Cohen et al. |
| 6,552,387 | B1 | 4/2003 | Eitan |
| 6,771,541 | B1* | 8/2004 | Park ...................... 365/185.22 |
| 7,046,559 | B2* | 5/2006 | Saito ...................... 365/185.03 |
| 2006/0141709 | A1* | 6/2006 | Lung et al. ................. 438/261 |

\* cited by examiner

*Primary Examiner*—Huan Hoang
(74) *Attorney, Agent, or Firm*—Stout, Uxa, Buyan & Mullins, LLP

(57) ABSTRACT

Pre-program verify levels for a multilevel read-only memory cell are generated dynamically. A determination takes into account a program verify level, an over-program budget, and a second-bit effect budget to generate pre-program verify levels. The generated pre-program verify levels mitigate issues of over-programming, hard-to-program, and second-bit effect.

29 Claims, 10 Drawing Sheets

| HP Mode | | | |
|---|---|---|---|
| State | PV | OB | SB |
| 00 | 5.0 V | 0.1 V | 0.4 V |
| 01 | 4.2 V | 0.2 V | 0.2 V |
| 10 | 3.5 V | 1.0 V | 0.0 V |
| 11 | 2.0 V | 0.0 V | 0.0 V |

FIG. 5A

| LP Mode | | | |
|---|---|---|---|
| State | PV | OB | SB |
| 00 | 5.0 V | 0.0 V | 0.0 V |
| 01 | 4.2 V | 1.0 V | 0.0 V |
| 10 | 3.5 V | 0.2 V | 0.2 V |
| 11 | 2.0 V | 0.1 V | 0.4 V |

FIG. 5B

METHOD OF DYNAMICALLY CONTROLLING PROGRAM VERIFY LEVELS IN MULTILEVEL MEMORY CELLS

CROSS-REFERENCE TO RELATED APPLICATIONS

This application is related to co-pending U.S. patent application Ser. No. 11/026,947, filed Dec. 29, 2004 and entitled A METHOD FOR PROGRAMMING MULTI-LEVEL NITRIDE READ-ONLY MEMORY CELLS, the contents of which are expressly incorporated herein by reference.

BACKGROUND OF THE INVENTION

1. Field of the Invention

The present invention relates generally to semiconductor operation methods and, more particularly, to methods for controlling verify levels in semiconductor memories.

2. Description of Related Art

Non-volatile semiconductor memory devices are designed to maintain programmed information even in the absence of electrical power. Non-volatile memories in common use today include read-only memories (ROMs) that typically are programmed to store a fixed bit pattern at the time of manufacture and that subsequently cannot be reprogrammed. Programmable read-only memories (PROMs) are a form of field-programmable memory devices that can be programmed once by a PROM programmer. Erasable programmable read-only memories (EPROMs) are programmable like PROMs, but can also be erased, for example, by exposure to ultraviolet light that places all bits in the memory to a known state (e.g., a logic '1'). Electrically erasable programmable read-only memories (EEPROMs) are similar to EPROMs except that individual stored bits may be erased electrically.

Nitride read-only memory (NROM) devices represent a relatively recent development in non-volatile memory technology. (The acronym "NROM" is a part of a combination trademark of Saifun Semiconductors Ltd. of Netanya, Israel.) These devices store information in the form of localized trapped charges and may be referred to as localized trapped-charge ROM devices or cells. Some localized trapped-charge ROM devices are capable of storing multiple bits per cell. According to a typical implementation, charge can be stored in two regions of a charge-trapping layer that forms part of a typical localized trapped-charge ROM cell. Further, a multiple-bit localized trapped-charge ROM cell may be formed of a single transistor, leading to densities of localized trapped-charge ROM arrays that are higher than those achieved by many other forms of non-volatile memories.

A multilevel non-volatile memory device, for example, a localized trapped-charge ROM cell, is programmed by applying a programming pulse to terminals of the device. The programming pulse has the effect of injecting charge into a charge-trapping layer of the device, thereby raising a threshold voltage, $V_t$. Some multilevel devices have two data regions in the charge-trapping layer that are able to store independent data values by raising the $V_t$ in a localized area near a source or drain of a multilevel memory cell. When the $V_t$ is able to take on two distinguishable values, then each data region is capable of storing one bit of information.

Programming a data region of a multilevel memory cell normally involves applying a programming pulse and then performing a read operation, known as a verify operation, that estimates the value of $V_t$ achieved by the programming pulse. Depending upon the estimated value of $V_t$, a subsequent programming pulse may be applied. The process continues until a desired $V_t$ value is achieved, at which time the data region is said to be programmed. When two data regions are involved, a separate $V_t$ is programmed/estimated for each data region.

Several factors intervene to make the process just introduced more difficult than has been suggested. These factors include an over-program effect whereby the programmed $V_t$ value is higher than desired. Over-programming is an undesirable situation that has a detrimental effect on the long-term operation of a multilevel memory cell. Alternatively, a hard-to-program effect can make it difficult to achieve a sufficiently large value of $V_t$ in some cases. Additionally, some coupling inevitably may exist between two regions in a multilevel memory cell. As a result, programming one data region can have an undesired effect on the programming of the other data region in the same cell, a phenomenon that has been referred to as a second-bit effect. Each of the above factors can act to reduce the utility of multilevel memory device architectures.

A need thus exists in the prior art to provide a method of programming multilevel memory cells that may reduce the undesirable effects of over-programming and hard-to-program problems. A further need exists for a way of reducing undesired aspects of the second-bit effect.

SUMMARY OF THE INVENTION

The present invention addresses these needs by providing a method of programming a multilevel read-only memory cell that includes dynamically generating pre-program verify (pre-PV) levels according to the memory states of the multilevel read-only memory cell. The invention herein disclosed may reduce the undesirable issues of over-programming, hard-to-program, and the second-bit effect in multilevel read-only memory cells.

An embodiment of method of the present invention comprises providing a multilevel read-only memory cell having a plurality of data regions, which may comprise, for example, a left data region and a right data region. A plurality of memory states is defined for each data region in the multilevel read-only memory cell, and a program verify (PV) level is associated with each memory state. In particular, a plurality of left memory states may be defined for the left data region and a plurality of right memory states may be defined for the right data region. Pre-PV levels may be generated, depending, in part, upon the PV levels. At least one of the plurality of data regions may be programmed, and the programming may be verified using at least one of the pre-PV levels. A plurality of second-bit effect budgets (SBs) further is established for the plurality of memory states in a data region. A plurality of pre-PV levels is then determined for the plurality of left data regions. A plurality of pre-PV levels likewise is determined for the plurality of right data regions. After selecting a left memory state, a pre-PV level for the left data region is generated according to the PV level of the left memory state, an over-program budget (OB) for the left memory state, and the SB for the right memory state. Similarly, after selecting a right memory state, a pre-PV level for the right data region is generated according to the PV level of the right memory state, the OB for the right memory state, and the SB for the left memory state.

According to another implementation of the method, a pre-PV level for a left data region is generated by calculating a sum of an OB value for a left memory state and an SB value for a right memory state. The sum is then subtracted from a PV level for the left memory state to determine the pre-PV level for the left data region. A pre-PV level for the right data region may be generated by interchanging the roles of "left" and "right" and following the same procedure.

While the apparatus and method has or will be described for the sake of grammatical fluidity with functional explanations, it is to be expressly understood that the claims, unless expressly formulated under 35 U.S.C. 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 U.S.C. 112 are to be accorded full statutory equivalents under 35 U.S.C. 112.

Any feature or combination of features described herein are included within the scope of the present invention provided that the features included in any such combination are not mutually inconsistent as will be apparent from the context, this specification, and the knowledge of one skilled in the art. For purposes of summarizing the present invention, certain aspects, advantages and novel features of the present invention are described herein. Of course, it is to be understood that not necessarily all such aspects, advantages or features will be embodied in any particular embodiment of the present invention. Additional advantages and aspects of the present invention are apparent in the following detailed description and claims that follow.

BRIEF DESCRIPTION OF THE FIGURES

FIG. 5A is a table illustrating an example of program values, over-program budget values, and second-bit effect budget values for a multilevel memory cell operated in a high program mode;

FIG. 5B is a table illustrating an example of program values, over-program budget values, and second-bit effect budget values for a multilevel memory cell operated in a low program mode;

DETAILED DESCRIPTION OF THE PRESENTLY PREFERRED EMBODIMENTS

Figure 1:
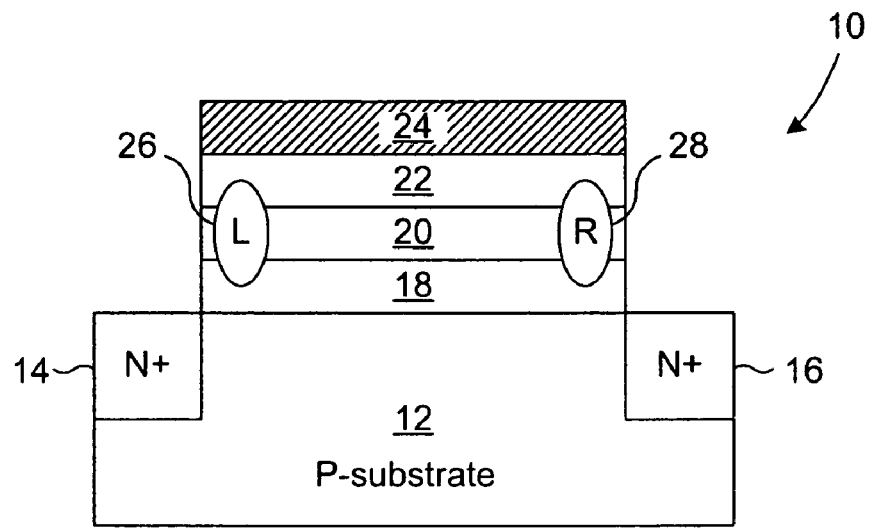
FIG. 1 is a cross-sectional diagram of a multilevel memory cell.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. The present invention may be practiced in conjunction with various forms of integrated circuit memories that are conventionally used in the art, and only so much of the commonly practiced programming steps are included herein as are necessary to provide an understanding of the present invention. The present invention has applicability in the field of semiconductor memories and programming methods in general. For illustrative purposes, however, the following description pertains to a method of programming a multilevel read-only memory cell.

Referring more particularly to the drawings, FIG. 1 is a cross-sectional diagram of a multilevel read-only memory cell 10. For convenience, the multilevel read-only memory cell 10 is referred to simply as multilevel memory cell 10 in that which follows. The multilevel memory cell 10 is formed in a P-type substrate 12 in which may be formed N+ diffusion regions that function as a source 14 and a drain 16. In operation, a channel may form in the substrate 12 between the source 14 and the drain 16. The illustrated embodiment further comprises a first oxide layer 18 formed above the channel. A silicon nitride layer 20 overlies the first oxide layer 18, a second oxide layer 22 overlies the silicon nitride layer 20, and a gate 24 overlies the second oxide layer 22. The gate 24 may be formed of polysilicon. The three-layer feature that comprises the first oxide layer 18, the silicon nitride layer 20, and the second oxide layer 22 can be referred to as an oxide-nitride-oxide (ONO) layer. The ONO layer in the present embodiment is illustrated with a left data region 26 and a right data region 28.

A multilevel memory cell may be operated according to various operating modes. As one example, referred to herein as a Program-to-High, Erase-to-Low, or, more simply, a High Program (HP) mode, hot electron injection may be used to program a memory cell to one of a plurality of "high" threshold voltage ($V_t$) levels. Such a memory cell may be erased to a low $V_t$ condition by hot-hole injection. For example, a multilevel memory device may employ a low $V_t$ value of about 2.0 volts. A data region of the same device may be programmed to one of a plurality of high $V_t$ values of, for example, about 3.5 V, 4.2 V, and 5.0 V, thereby providing for the storage of two bits of information.

According to another exemplary operating mode, referred to herein as a Program-to-Low, Erase-to-High, or, more simply, a Low Program (LP) mode, a multilevel memory device may be erased to a high $V_t$ condition by Fowler-Nordheim (FN) tunneling. FN can inject electrons into the charge trapping region, resulting in a high $V_t$ value of, for example, about 5.0 V. The device then may be programmed by hot-hole injection to one of a plurality of lower $V_t$ values of, for example, about 4.2 V, 3.5 V, and 2.0 V, again providing for the storage of two bits of information.

Describing the HP and LP operating modes of multilevel memory cells in more detail, the HP operating mode is first considered. According to an example of the HP operating mode, the left data region 26 of the multilevel memory cell 10 may be placed into an erased, i.e. a low $V_t$, condition by applying a negative voltage of about −5 V to the gate 24 of the multilevel memory cell 10. A positive supply voltage of about 5 V is applied to the source 14, and the drain 16 is grounded. This combination of bias voltages can cause hot holes to be injected into the left data region 26, thereby lowering V, in a neighborhood of the source 14 to a relatively low value, e.g., about 2 V. Conversely, the right data region 28 of the multilevel memory cell 10 may be placed into an erased condition by biasing the gate 24 to about −5 V, grounding the source 14, and applying a positive supply voltage of about 5 V to the drain 16. This bias condition can cause hot holes to be injected into the right data region 28, which may lower $V_t$ in a neighborhood of the drain 16 to a relatively low value, e.g., about 2 V.

A multilevel memory cell operating in the HP mode also may be programmed. For example, the left data region 26 of the multilevel memory cell 10 may be programmed by applying a relatively large positive voltage, e.g., about 10 V, to the gate 24 of the multilevel memory cell 10, grounding the drain 16, and applying a medium positive voltage of about 6 V to the source 14. The bias condition just described may cause hot electrons to be injected from the channel into the left data region 26, thereby raising $V_t$ in a neighborhood of the source 14 to one of a plurality of relatively high values such as 3.5 V, 4.2 V, or 5.0 V in a representative embodiment. The right data region 28 may be programmed in a similar manner by reversing the roles of the source 14 and drain 16.

A multilevel memory cell also may be operated in the LP mode. For example, the multilevel memory cell 10 illustrated in FIG. 1 may be erased to a high $V_t$ condition by applying a relatively large negative voltage, e.g. about −18 V, to the gate 24 of the multilevel memory cell 10, grounding the substrate 12, the source 14 and drain 16. This bias condition may cause electrons to be injected from the gate into the charge-trapping layer 20 of the multilevel memory cell 10 by FN tunneling. Both the left data region 26 and the right data region 28 may be erased by this method, which has the effect of raising $V_t$ near both data regions. According to an exemplary embodiment, FN tunneling may be used to raise $V_t$ to a level of about 5.0 V.

To program the left data region 26 of the multilevel memory cell 10 illustrated in FIG. 1 when operating in the LP mode, a negative voltage of about −5 V may be applied to the gate 24, a positive supply voltage of about 5 V may be applied to the source 14, and the drain 16 may be grounded. This bias condition may be used to inject hot holes into the left data region 26, thereby lowering $V_t$, in a neighborhood of the source 14 to one of a plurality of relatively low values such as 4.2 V, 3.5 V, or 2.0 V in a typical embodiment. To program the right data region 28, a similar method may be used with the roles of the source 14 and the drain 16 reversed.

Figure 2:
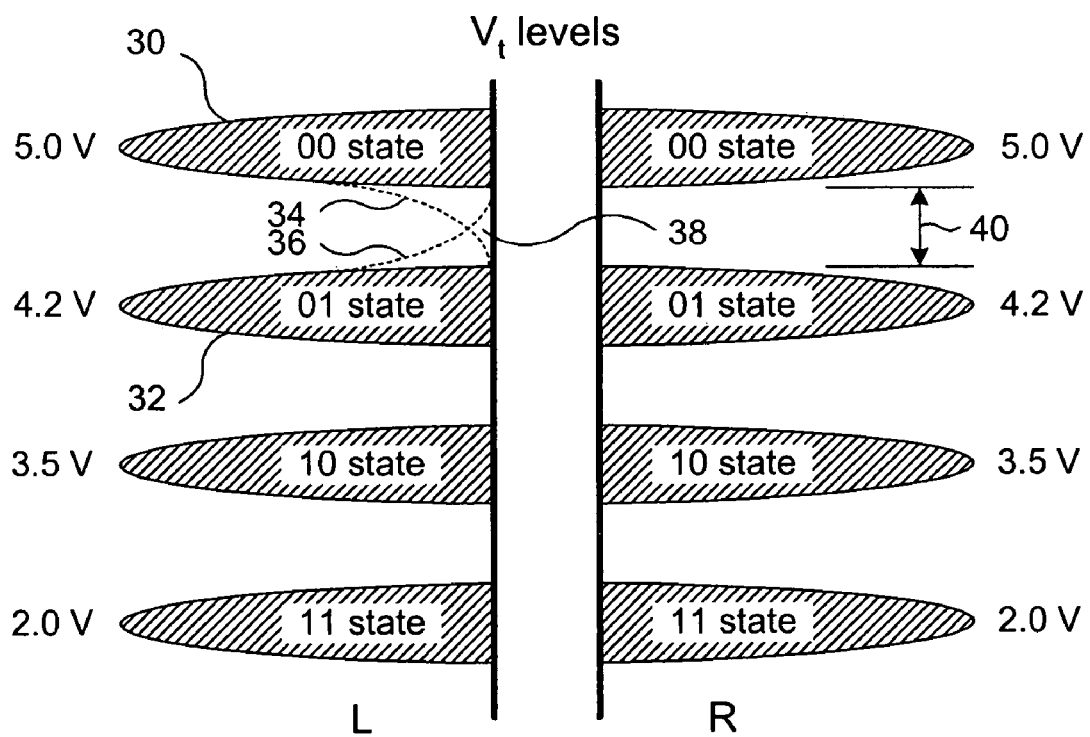
FIG. 2 is a chart illustrating multiple program verify levels associated with two data regions in a typical multilevel memory cell.

FIG. 2 is a chart illustrating multiple program verify (PV) levels for two 4-level data regions (L, R) in a multilevel memory cell (4-bit cell). In modified embodiments, each of the data regions (L, R) may comprise, for example, fewer levels, such as 2-levels (2-bit/cell). The PV levels represent distinguishable values of $V_t$ that may be associated with distinct memory states. For example, PV=5.0 V (corresponding to a $V_t$ of 5.0 V) may be associated with memory state '00' as illustrated. More precisely, a distribution 30 of values around 5.0 V may be associated with memory state '00'. In the present context, the term "distribution" represents a statistical distribution of measurements carried out on a large number of multilevel memory cells. Distribution 30 is represented in the diagram by a rounded cone shape that illustrates the 5.0 V PV level. Similarly, a distribution 32 of PV levels around PV=4.2 V may be associated with memory state '01'. PV levels of 3.5 V and 2.0 V may be associated with respective memory states '10'and '11'. The '11' memory state may correspond to an erased condition for the multilevel memory cell when operated in the HP mode.

It should be noted that the PV levels and memory states for separate data regions of a multilevel memory cell are independent. For example, with reference to FIG. 1, left data region 26 and right data region 28 may be programmed independently. These independently programmable data regions are represented, respectively, by L and R in FIGS. 2, 3, 4, 7, 8, 9, and 10. That is, the L data region may be programmed to one memory state while the R data region may be programmed to the same or a different memory state.

The PV levels associated with memory states in an embodiment as illustrated in FIG. 2 need to be distinguishable. Thus, the separate distributions that accompany each PV levels should not overlap in order that memory states can be identified uniquely and reliably. For example, distribution 30 and distribution 32 should not be so wide that they overlap as indicated by the dotted lines 34, 36, respectively, to form an overlap region 38. Estimated $V_t$, values occupying such an overlap region 38 would not be unambiguously associable with distribution 30 or distribution 32. That is, the 5.0 V and 4.2 V PV levels would not be distinguishable, so that memory states '00' and '01' could not be separated. In order to avoid forming such an overlap region, the distributions associated with PV levels should be separated, for example, by a guard band 40 of forbidden $V_t$ values. The present invention may aid in creating relatively narrow $V_t$ distributions, thereby enhancing the separation of PV levels.

The method of the present invention may apply to both HP and LP modes of operation of a multilevel memory cell. For purposes of illustration, the method is first described as it may apply to the HP mode, followed by a description of the method as applied to multilevel memory cells operated in the LP mode.

One way of reducing the width of $V_t$ distributions is to use a page-verify method employing a fixed PV level for each memory state. Although such a method may reduce issues of second-bit effect as well as an array effect, the page-verify method may encounter issues of over-programming and hard-to-program when applied to 4-bit/cell localized trapped-charge read-only memory devices. To further narrow $V_t$ distributions, a dynamically assigned pre-PV level further may be defined for each memory state according to a method of the present invention. In contrast, some prior art methods may employ only a fixed PV level for each memory state. Other prior art methods may employ a fixed PV level and a fixed pre-PV level. Such prior art methods can result in $V_t$ distributions that may be larger than about 200 mV. The use of dynamically assigned pre-PV levels in accordance with the present invention may result in $V_t$ distributions as narrow as about 100 mV in representative embodiments.

According to an implementation of the method of the present invention, a data region may be programmed, i.e., given a memory state, in two phases. In the first phase, a first programming method is used to program the $V_t$ distribution to a pre-PV level. In the second phase, a second programming method is used to adjust the $V_t$ distribution to a prescribed PV level for the given memory state.

Figure 3:
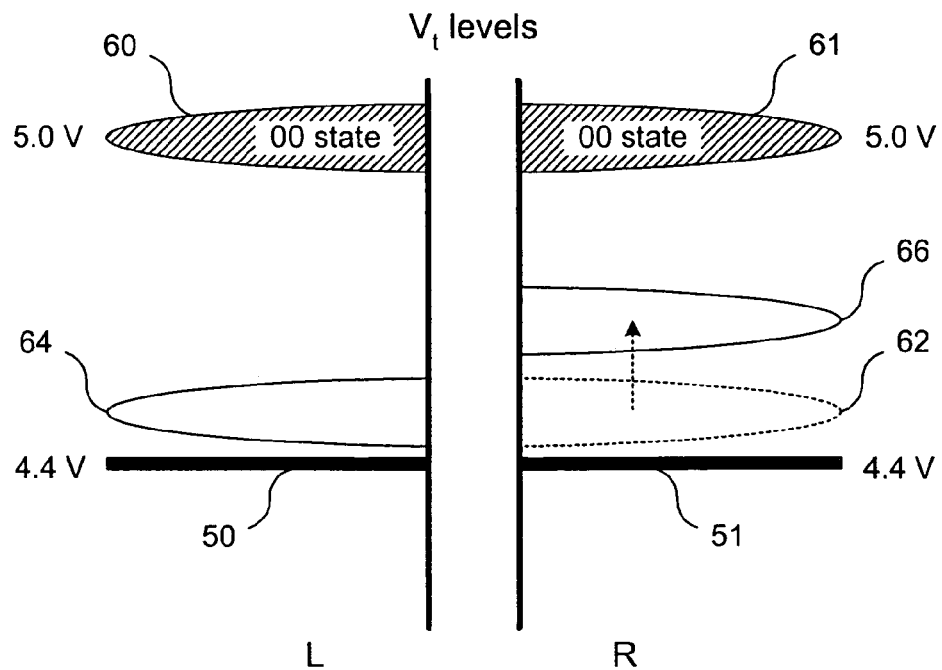
FIG. 3 is a chart illustrating the effect of programming a multilevel memory cell with balanced program values.

FIG. 3 is a chart illustrating an effect of programming a multilevel memory cell having left (L) and right (R) data regions with what may be referred to as balanced PV levels. In the illustrated example, both the left (L) and right (R) data regions are first erased to a '11' memory state and then are programmed to a '00' memory state, i.e., to a PV level of 5.0 V. For such a balanced case, fixed pre-PV levels may be implemented. Pre-PV levels 50, 51 of 4.4 V for the respective left (L) and right (R) data regions and associated with the '00' memory state are employed in this example. According to an illustrative implementation of the method of the present invention, the right (R) data region is programmed in a first programming phase to a pre-PV level 51 of 4.4 V. This program step yields a distribution 62 of $V_t$ values in the right (R) data region. Subsequent first-phase programming of the left (L) data region to a pre-PV level 50 of 4.4 V yields a similar distribution 64 of $V_t$ values in the left (L) data region. First-phase programming of the left (L) data region may also elevate $V_t$ distribution 62 to a new position represented by $V_t$ distribution 66 in the right (R) data region as shown. Thus, the programming of one data region in a multilevel memory cell can have an effect on the programmed level of another data region in the same multilevel memory cell, a condition that has been referred to as the second-bit effect. For a case of balanced PV levels, the present invention exploits the second-bit effect to achieve an advantageous end. That is, after first phase programming of the left (L) and right (R) data regions is completed, the position of $V_t$ distribution in the right (R) data region in this example is improved relative to its pre-PV level. In particular, $V_t$ distribution 66 lies closer to the PV=5.0 V level than does $V_t$ distribution 62. Accordingly, second-phase programming of the right (R) data region to the PV=5.0 V level may be accomplished in a time shorter than the time required to program the right (R) data region in the absence of the second-bit effect. To summarize, use of fixed pre-PV levels 50, 51 (4.4 V in the present example) may lead to relatively efficient programming of the '00' memory state in both the left (L) and right (R) data regions when the PV levels are equal, i.e., balanced. Provided pre-PV levels are properly chosen, it will be apparent that balanced programming (i.e., programming states where both data regions are programmed to the same PV level) associated with '01', '10', and '11' memory states (FIG. 2) also may be successful using fixed pre-PV levels.

Figure 4:
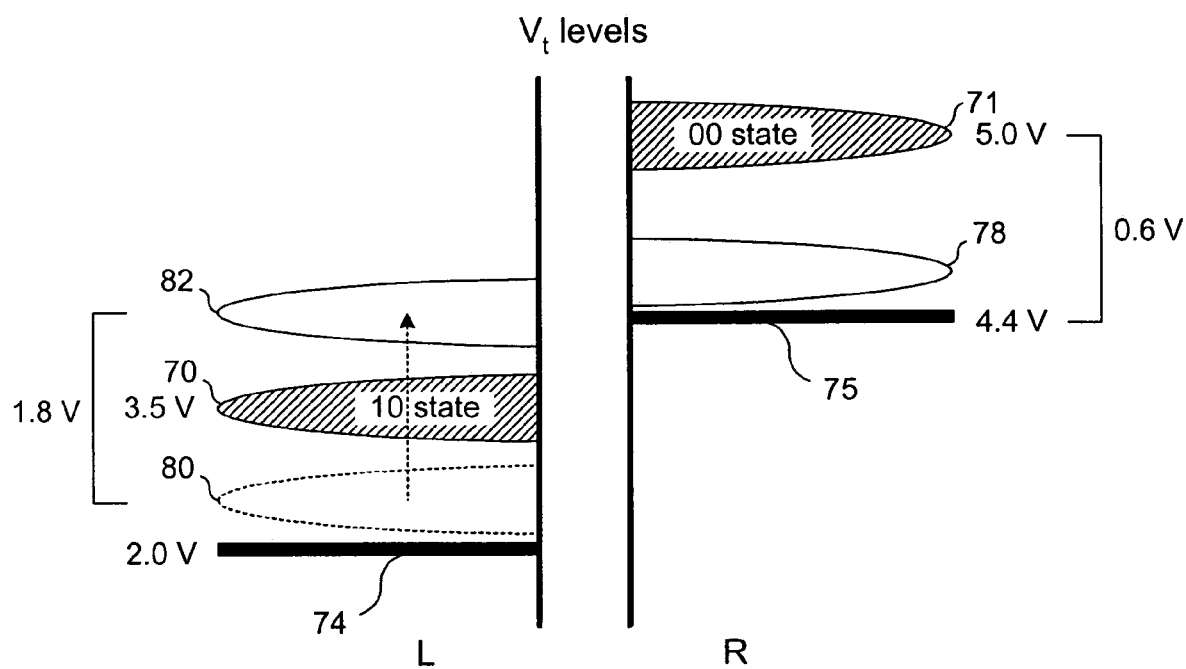
FIG. 4 is a chart illustrating the effect of programming a multilevel memory cell with unbalanced program values.

When PV levels are unbalanced (e.g., left (L) data region programmed to PV=3.5 V and right (R) data region programmed to PV=5.0 V), then issues of over-programming (caused by the second-bit effect) and hard-to-program (caused by wider distance from pre-PV to PV) can arise. An example is illustrated in FIG. 4 in which a distribution 70 of $V_t$ values corresponds to a PV level of 3.5 V for a left (L) data region and a distribution 71 of $V_t$ values corresponds to a PV level of 5.0 V for a right (R) data region. According to this example, a fixed pre-PV level of 2.0 V is used for a '10' memory state (PV=3.5V) while a fixed pre-PV level of 4.4 V is used for a '00' memory state (PV=5.0V). After first-phase programming, the left (L) data region is programmed to the pre-PV level 74 of 2.0 V yielding a $V_t$ distribution 80. The right data region, after first-phase programming, is programmed to the pre-PV level of 4.4 V represented by $V_t$ distribution 78. The pre-PV level for state '00' in the right (R) data region is 0.6 V lower than the PV=5.0 V level, and so may represent a hard-to-program issue for second-phase programming, which must raise the $V_t$ distribution to the PV=5.0 V level. To compensate for this hard-to-program effect, second-phase programming may require a relatively long time to complete programming of the '00' memory state in the right (R) data region. Applying second-phase programming for a relatively long time to raise the $V_t$ distribution 78 in the right (R) data region to the PV level of 5.0 V may undesirably shift the $V_t$ distribution 80 in the left (L) data region to a new position 82. This shift, caused by the second-bit effect, may undesirably raise the $V_t$ distribution in the left (L) data region above the PV=3.5 V level prescribed for the '10' memory state, resulting in over-programming.

An aspect of the present invention addresses the hard-to-program and over-programming issues by introducing an over-program budget (OB) and a second-bit effect budget (SB). The OB is chosen to avoid over-programming a first data region during programming of the first data region. The SB is chosen to avoid over-programming the first data region during programming of a neighboring second data region. The OB and SB budgets can be used to dynamically generate a pre-PV level for each memory state in a data region of a multilevel memory cell, and may thereby narrow $V_t$ distributions associated with prescribed PV levels and reduce programming time.

FIG. 5A is a table illustrating an example of a set of OB and SB values for a multilevel memory cell operated in the HP mode. Entries in the table assign to each memory state a PV level, an OB value, and an SB value. For example, a '10' memory state is assigned a PV level of 3.5 V, an OB value of 1.0 V, and an SB value of 0.0 V. Once OB and SB budgets are determined, the present invention employs the budgets in a novel way to determine a pre-PV level for each data region.

In a multilevel memory cell having first and second data regions that are to be programmed to respective first and second memory states, a pre-PV level (for the first data region, for example) is determined according to a dynamic adjustment, D1, given by:

$$D1 = OB(\text{first memory state}) + SB(\text{second memory state}).$$

(Equation 1.1)

When operated in the HP mode, the pre-PV level for the first data region is given by:

pre-PV(first data region)=PV(first memory state)−D1 (Equation 1.2H)

First-phase programming of the first data region then comprises programming the first data region to the pre-PV level given by Equations 1.1 and 1.2H. Second-phase programming of the first data region adjusts a $V_t$ distribution of the first data region to a PV level corresponding to the first memory state. It should be clear that a dynamic adjustment, D2, for the second data region can be given by:

D2=OB(second memory state)+SB(first memory state) (Equation 2.1)

and that, when operated in the HP mode, a pre-PV level for the second data region may be given by pre-PV(second data region)=PV(second memory state)−D2. (Equation 2.2H)

Figure 6:
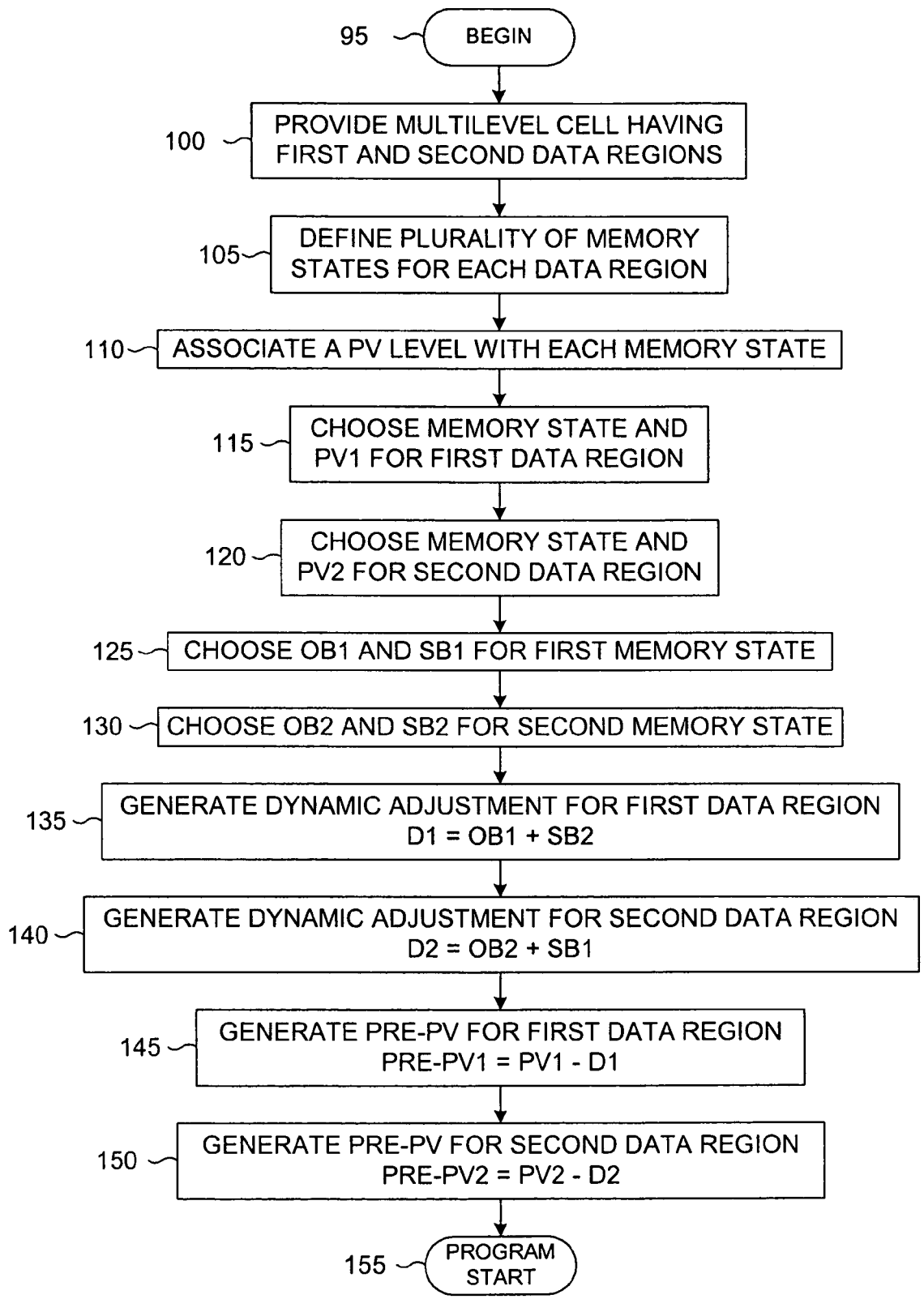
FIG. 6 is a flow diagram that describes an embodiment of a method of the present invention whereby a multilevel read-only memory cell may be programmed.

FIG. 6 is a flow diagram that illustrates an example of how OB and SB values can be used to generate a pre-PV level for a given data region. According to this illustration, a multilevel memory cell is provided at step 100, the multilevel memory cell having first and second data regions. An example of such a cell is the multilevel memory cell 10 illustrated in FIG. 1. As an example, the left data region 26 may be referred to as the first data region, and the right data region 28 may be referred to as the second data region. A plurality of memory states then is defined for each data region in the multilevel memory cell at step 105. For example, four memory states for each data region (L, R) may be defined as illustrated in FIG. 2. A PV level is then associated with each memory state at step 110 as shown in FIGS. 2 and 5. According to the memory state to be programmed, a program verify level, PV1, is chosen for the first data region at step 115. Similarly, a program verify level, PV2, is chosen for the second data region at step 120. The information in FIG. 5A provides one example of how values for PV1 and PV2 may be chosen. For example, a first memory state for the first data region may be '01' in which case FIG. 5A prescribes that PV1=4.2 V. As another example, a second memory state for the second data region may be '00' in which case PV2=5.0 V. An OB value, OB1, and an SB value, SB1, then are chosen for the first memory state at step 125. Likewise, an OB value, OB2, and an SB value, SB2, are chosen for the second memory state at step 130. Continuing to employ the assignments presented in FIG. 5A, as an example, OB1=0.2 V, SB1=0.2 V, OB2=0.1 V, and SB2=0.4 V.

A dynamic adjustment, D1, is then computed according to Equation 1.1 at step 135. A dynamic adjustment, D2, also is computed according to Equation 2.1 at step 140. Using the assignments in FIG. 5A, in the present example,

D1=0.2+0.4=0.6 V, and

D2=0.1+0.2=0.3 V.

A first pre-PV level for the first data region is then determined according to Equation 1.2H at step 145. For example, if the first memory state is '01', then, according to the assignments in FIG. 5A, the first pre-PV level is pre-PV (first data region)=4.2−0.6=3.6 V.

Similarly, a second pre-PV level for the second data region is determined according to Equation 2.2H at step 150. Continuing with the present example, the second pre-PV level is pre-PV (second data region) 5.0−0.3=4.7 V, when the assignments illustrated in FIG. 5A are used. With values for the PV levels and the pre-PV levels determined, programming of the multilevel cell may commence using a first programming method at step 155.

The exemplary OB and SB values presented in FIG. 5A may be created by noting that, generally, higher $V_t$ levels may require longer programming times than lower $V_t$ levels. Hence, smaller OB values may be needed in those cases to prevent over-programming. However, higher $V_t$ levels may cause larger second-bit effects on other data regions, so that larger SB values may be needed in those cases to prevent over-programming due to the second-bit effect.

Figure 7:
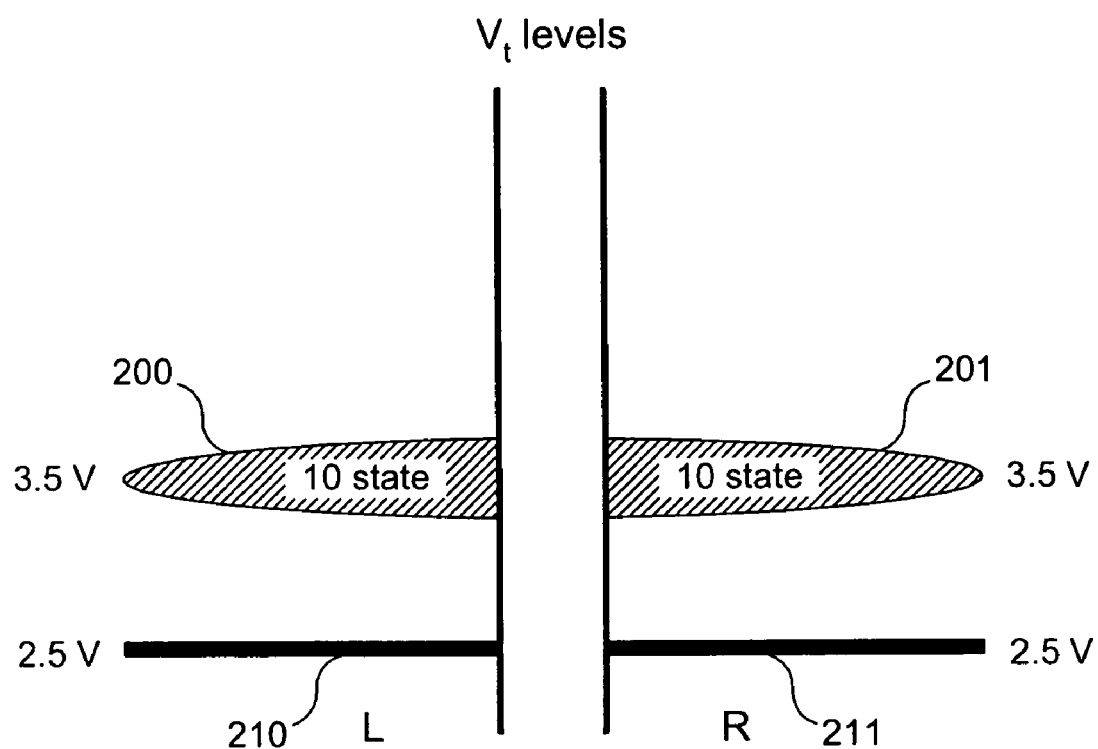
FIG. 7 is a chart illustrating an example of a multilevel memory cell, which is programmed with balanced program verify levels according to the present invention.

An example of the application of the method of FIG. 6 to a case of balanced program values is illustrated in FIG. 7. The assignments of FIG. 5A are used to generate pre-PV levels for left (L) and right (R) data regions corresponding to a '10' memory state for both data regions. Taking these left (L) and right (R) data regions as an example, FIG. 5A dictates that PV=3.5 V for the '10' memory state, indicating that the left (L) and right (R) data regions are to be programmed with respective $V_t$ distributions 200, 201 at PV levels of 3.5 V. Thus, distributions 200, 201 of $V_t$ values at program levels of 3.5 V are desired for the left (L) and right (R) data regions. FIG. 5A gives an OB value of 1.0 V for the '10' memory state and an SB value of 0.0 V for the '10' memory state. Taking the left (L) data region as a first data region and the right (R) data region as a second data region, a dynamic adjustment level, D1, for the first data region is:

D1=1.0+0.0=1.0 V according to Equation 1.1.

Using the PV level for the first data region of 3.5 V, a pre-PV level for the first data region is:

pre-PV(first data region)=3.5−1.0=2.5 V according to Equation 1.2H. It should be clear that a pre-PV level for the second data region also is 2.5 V.

Figure 8:
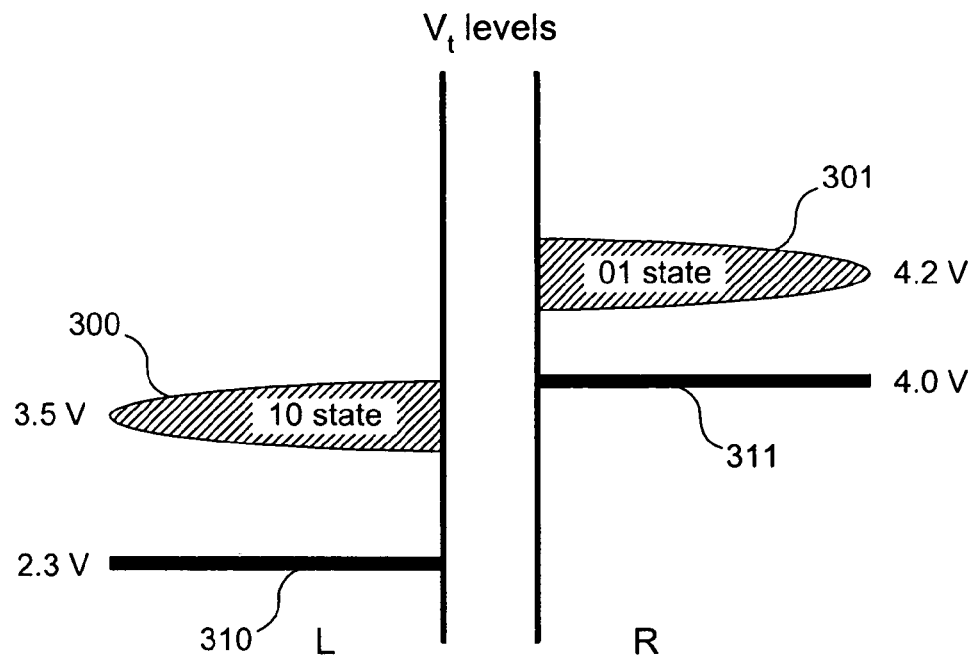
FIGS. 8 and 9 are charts that depict examples of multilevel memory cells programmed with unbalanced program verify levels in accordance with the present invention.

FIG. 8 illustrates an example of applying the method of FIG. 6 to a case having unbalanced program verify levels. The assignments of FIG. 5A are used as before. A PV level of 3.5 V is associated with a '10' memory state for a left (L) data region, and a right (R) data region is to be programmed to a '01' memory state having a PV level of 4.2 V. These memory states correspond, respectively, to distribution 300 of $V_t$ values for the left (L) data region and distribution 301 of $V_t$ values for the right (R) data region. The '10' memory state of the left (L) data region has an OB value of 1.0 V and an SB value of 0.0 V. For the '01' memory state of the right (R) data region, OB=0.2 V, and SB=0.2 V. Again, the left (L) data region may be considered as a first data region, and the right (R) data region may be considered to be a second data region.

A dynamic adjustment, D1, for the first data region is given using Equation 1.1 as:

D1=1.0+0.2=1.2 V.

A pre-PV level 310 for the first data region, according to Equation 1.2H, is pre-PV(first data region)=3.5−1.2=2.3 V.

Similarly, from Equations 2.1 and 2.2H, and with reference to FIG. 5A,

D2=0.2+0.0=0.2V.

A pre-PV level 311 for the second data region is, from Equation 2.2H, pre-PV(second data region)=4.2−0.2=4.0 V.

Figure 9:
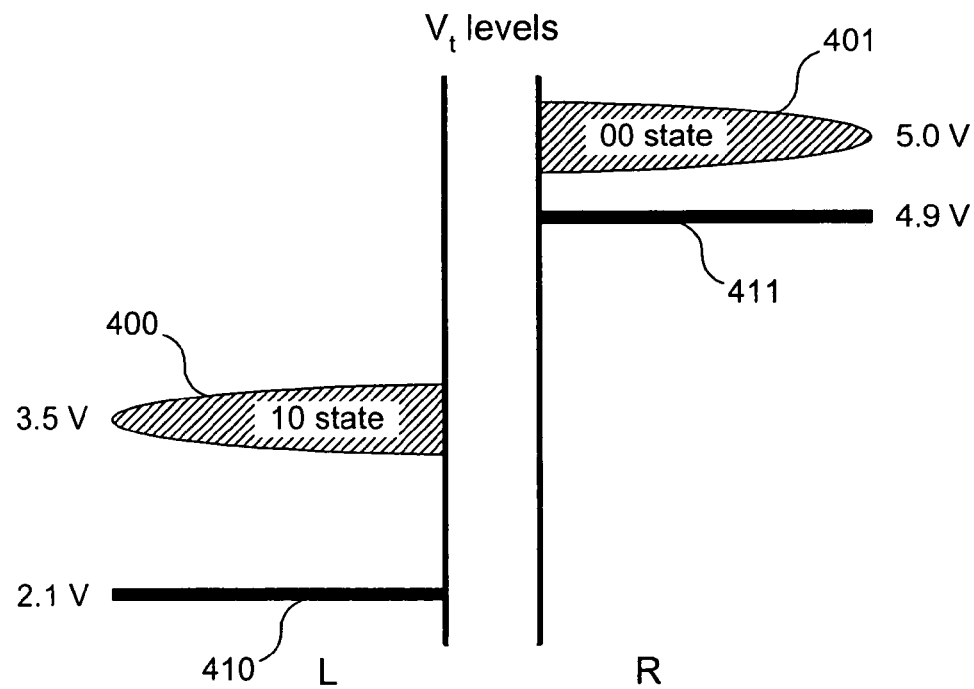

FIG. 9 demonstrates application of the method of the present invention to the situation considered in FIG. 4 in which hard-to-program and over-program issues were encountered when prior art methods were applied. Following the method of FIG. 6, and with continuing reference to FIG. 5A, a PV level for a '00' memory state of a right (R) data region is 5.0 V, and a PV level for a '10' memory state of a left (L) data region is 3.5 V. Thus, a distribution 401 of $V_t$ values at the PV level of 5.0 V is desired for the right (R) data region, and a distribution 400 of $V_t$ values at the PV level of 3.5 V is desired for the left (L) data region. An OB value for the '00' memory state of the right (R) data region is 0.1 V, and an SB value for the '10' memory state of the left (L) data region is 0.0 V. Therefore, considering the right (R) data region to be a first data region, and considering the left (L) data region to be a second data region, a dynamic adjustment for the right (R) data region is, from Equation 1.1,

D1=0.1+0.0=0.1 V.

A pre-PV level for the right (R) data region is, from Equation 1.2H, pre-PV(right data region)=5.0−0.1=4.9 V.

Similarly, a dynamic adjustment for the left (L) data region is, from Equation 2.1,

D2=1.0+0.4=1.4 V, and a pre-PV level for the left (L) data region is, from Equation 2.2H, pre-PV(left data region)=3.5−1.4=2.1 V.

The difference in FIG. 4 between the PV level for the right (R) data region (i.e., 5.0 V) and the pre-PV level 75 for the right (R) data region (i.e., 4.4 V) was 5.0−4.4=0.6 V, representing a hard-to-program issue. The corresponding difference in FIG. 9 is only 5.0−4.9=0.1 V. Therefore, the effect of the hard-to-program issue may be significantly reduced. With regard to the left (L) data region, it may be noted that the left (L) data region pre-PV level 410 in the present instance (i.e., 2.1 V) is higher than the pre-PV level 74 used in FIG. 4 (i.e., 2.0 V). Accordingly, it may appear that the over-program issue with regard to the '10' memory state in the left (L) data region is made worse, not better, when the method of the present invention is applied. This is not so, however, because the difference between the pre-PV level 411 and the PV level for the '00' memory state in the right (R) data region is now only 5.0−4.9=0.1 V, not 0.6 V as was the case when the prior art method was applied in FIG. 4. This smaller difference significantly reduces the hard-to-program issue for the '00' memory state in the right (R) data region. Accordingly, application of second-phase programming to raise the $V_t$ distribution in the right data region to a PV=5.0 V level will result in a smaller second-bit effect on the left (L) data region, thereby reducing the effect of the over-program issue. The method of the present invention thus addresses the hard-to-program and over-programming issues at the same time.

Although the preceding description has considered application of the method of the present invention to the HP operating mode of a multilevel memory cell, the method is not restricted to memory cells that operate in the HP mode. The same method may apply to multilevel memory cells operating in the LP mode, except that generated pre-PV levels are higher (not lower) than corresponding PV levels when the LP mode is employed. For multilevel memory cells operated in the LP mode, Equation 1.2H is modified to become:

pre-PV(first data region)=PV(first memory state)+D1 (Equation 1.2L)

and Equation 2.2H is modified to become pre-PV(second data region)=PV(second memory state)+D2.  (Equation 2.2L)

Figure 10:
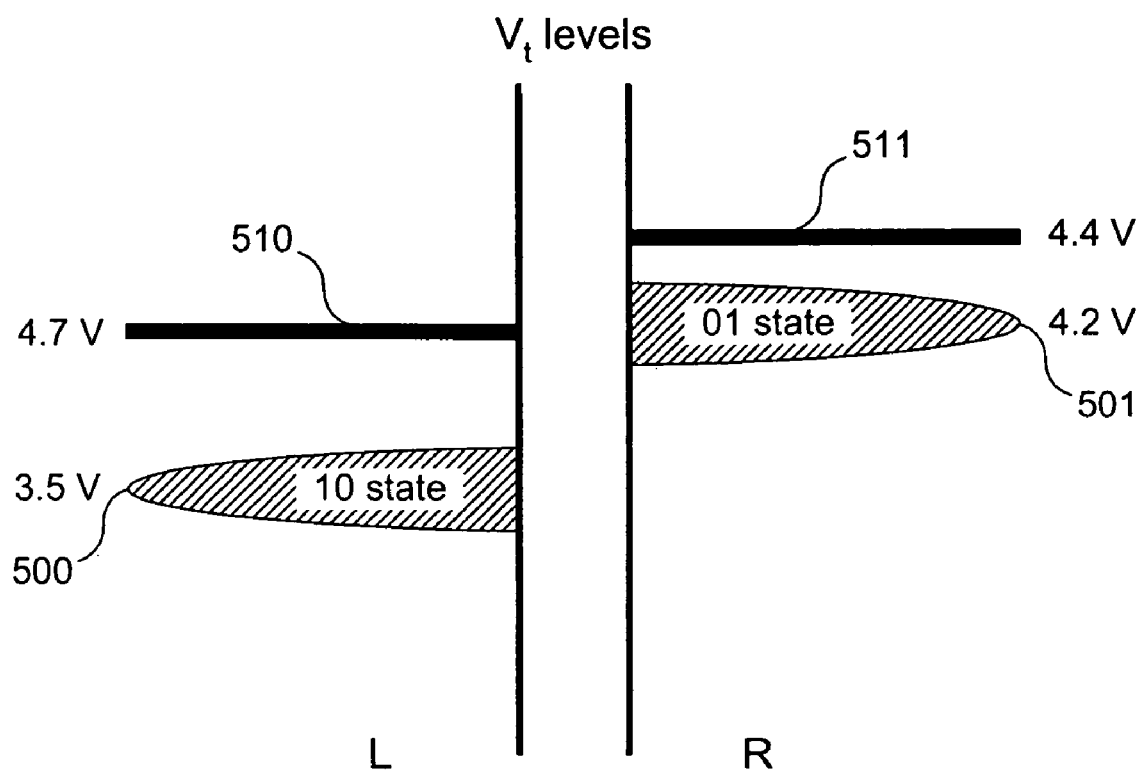
FIG. 10 is a chart illustrating the effect of programming a multilevel memory cell with unbalanced program verify levels using an alternative operating mode in accordance with a method of the present invention.

Determination of pre-PV levels for multilevel memory cells operated in the LP mode is then governed by Equations 1.1 and 1.2L for a first data region and by Equations 2.1 and 2.2L for a second data region. As an illustrative example, FIG. 5B again provides a table of PV/OB/SB values associated with a multilevel memory cell. Equations 1.1 and 1.2L may be applied to a case of programming a multilevel cell having left (L) and right (R) data regions as illustrated in FIG. 10. The PV/OB/SB values contained in FIG. 5B may be used for programming a first data region. Choosing the first data region to be the left (L) data region, the first data region is to be programmed to a PV level of 3.5 V represented by a $V_t$ distribution 500 corresponding to a '10' memory state. A second data region (chosen as the right (R) data region) is to be programmed to a PV level of 4.2 V according to a $V_t$ distribution 501 corresponding to a '01' memory state. OB values (FIG. 5B) corresponding to the respective '10' and '01' memory states are 0.2 V and 1.0 V, and SB values (FIG. 5B) that likewise correspond to memory states '10' and '01' are 0.2 V and 0.0 V, respectively. To operate a multilevel memory cell in the LP mode according to the method of the present invention, both the left (L) and right (R) data regions of the multilevel memory cell may first be erased to a high PV level of 5.0 V corresponding to a '00' memory state. A dynamic adjustment, D1 for the left (L) data region then may be computed from Equation 1.1 as:

D1=0.2+1.0=1.2 V.

A pre-PV level for the left (L) data region then may be calculated from Equation 1.2L as:

pre-PV(first data region)=3.5+1.2=4.7 V.

Similarly, a dynamic adjustment value for the right (R) data region may be computed from Equation 2.1 to yield:

D2=0.2+0.0=0.2 V, and a pre-PV level for the right (R) data region becomes, from Equation 2.2L, pre-PV(second data region)=4.2+0.2=4.4 V.

Second-phase programming of the left (L) and right (R) data regions then may be performed to achieve $V_t$ distributions 500 and 501 according to the respective PV=3.5 V and PV=4.2 V levels.

Figure 11A:
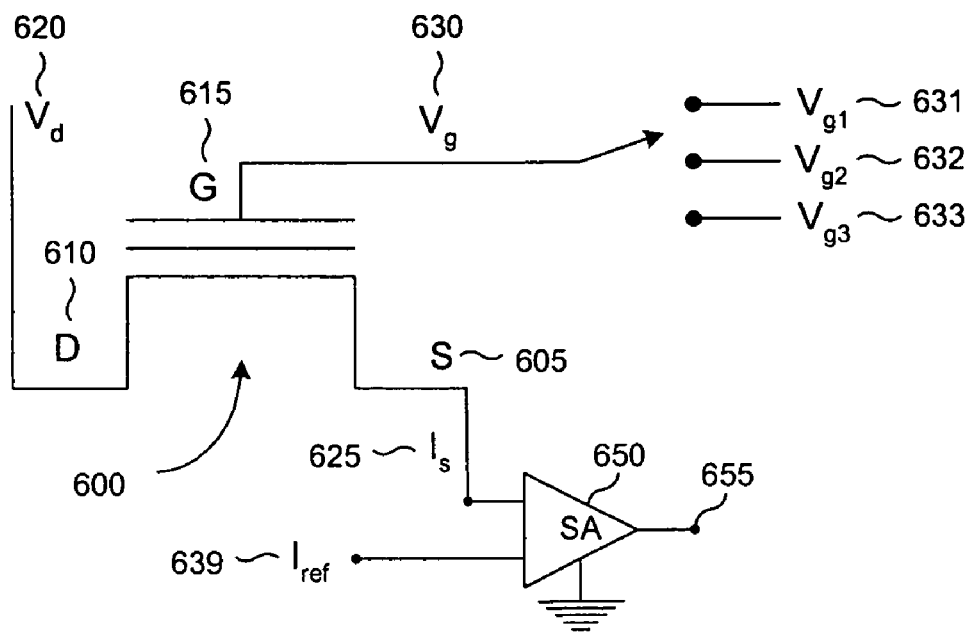
FIG. 11A is a schematic diagram illustrating a serial sensing method that may be used to read/verify a multilevel memory cell.

Once programmed to a prescribed PV level, the threshold voltage, $V_t$, in a neighborhood of a data region of a multilevel memory cell may be estimated, a process referred to as "reading" a data region. FIG. 11A is a schematic diagram illustrating an implementation of a serial sensing method that may be used to read a data region of an embodiment of a multilevel memory cell 600. The memory cell 600, which may comprise a source 605, a drain 610, and a gate 615, may comprise two data regions programmed to PV levels according to memory states as described herein. For example, PV levels of 5.0, 4.2, 3.5, and 2.0 V corresponding, respectively, to memory states '00', '01', '10', and '11', may be employed as illustrated in FIG. 2. To read a data region located, e.g., near the source 605 (i.e., a source data region), a small positive voltage 620, typically about 1.6 V, may be applied to the drain 610. Applying a positive voltage 630 to the gate 615 of the multilevel memory cell 600 may result in a source current 625 that can be sensed by a sense amplifier 650 that provides a low-impedance path to ground for the source 605 of the multilevel memory cell 600. According to a value of a reference current 639, an output 655, which may be a current or a voltage, of the sense amplifier 650 may respond to relative values of the source current 625 and the reference current 639. For example, the output 655 may be nominally zero when the source current 625 is less than the reference current 639 and may become positive when the source current 625 is greater than the reference current 639. According to the embodiment illustrated in FIG. 11A, one of three sensing voltages, $V_{g1}$ 631, $V_{g2}$ 632, and $V_{g3}$ 633 may be applied to the gate 615 of the multilevel memory cell 600, and the output 655 of the sensing amplifier 650 may be observed as an indication of the threshold voltage, $V_t$, and hence the associated memory state, of the source data region.

Figure 11B:
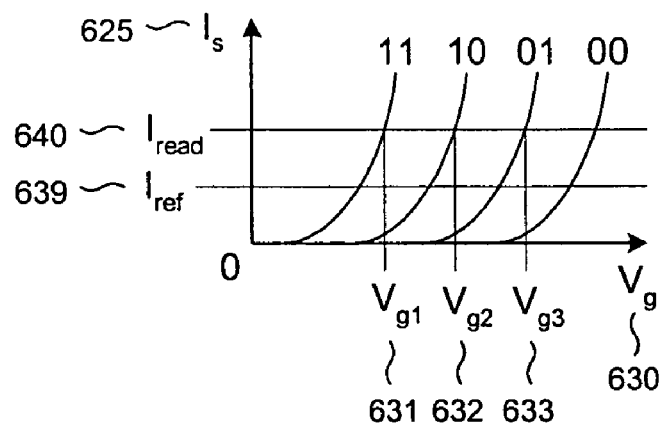
FIG. 11B is a chart showing relative voltages and currents associated with the serial sensing method shown in FIG. 11A.
Figure 13A:
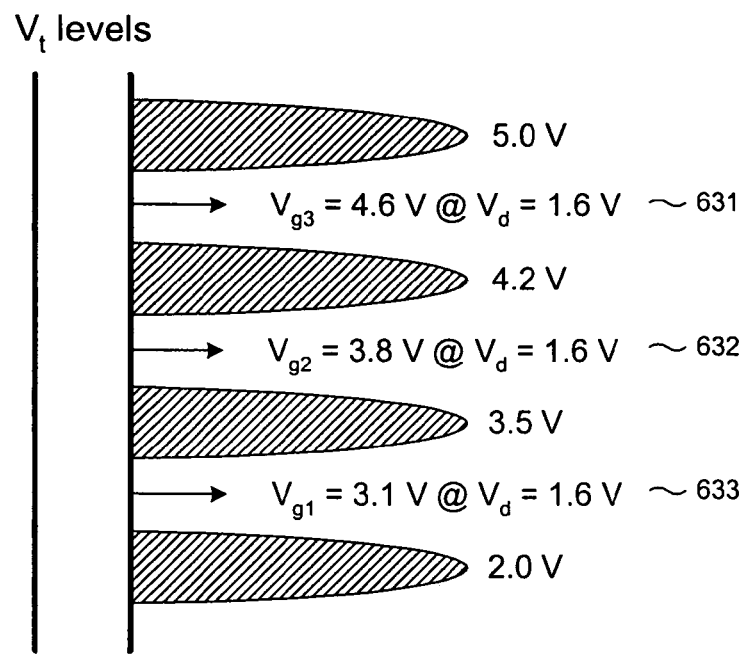
FIG. 13A is a chart illustrating multiple sensing voltages associated with the serial sensing method described in FIGS. 11A and 11B.

FIG. 11B is a chart showing relative voltages and currents that may be associated with the serial sensing method shown in FIG. 11A. Curves labeled, respectively, 11, 10, 01, and 00 comprise transfer characteristics of the source data region of the multilevel memory cell 600 that relate source current 625 to gate voltage 630 for each corresponding memory state, '11', '10', '01', and '00' of the source data region. For example, when the source data region of the multilevel memory cell 600 is programmed to a '11' memory state, the chart of FIG. 1B shows that a value of source current 625, denoted by $I_{read}$ 640 in FIG. 11B, may be chosen, the value Of $I_{read}$ 640 exceeding the reference current 639. At the same time, the chosen value of $I_{read}$ 640 may be less than the reference current 639 when the source data region is programmed to one of the '10', '01', and '00' memory states. With a value chosen for $I_{read}$ 640, a corresponding value may be chosen for sensing voltage $V_{g1}$ 631 corresponding to memory state '11' according to the chart of FIG. 11B. A similar method may be employed to choose values for sensing voltages $V_{g2}$ 632 and $V_{g3}$ 633 corresponding to respective memory states '10' and '01'. A chart shown in FIG. 13A illustrates exemplary values of the sensing voltages $V_{g1}$ 631, $V_{g2}$ 632 and $V_{g3}$ 633 associated with the PV levels depicted in FIG. 2, the sensing voltages having been chosen according to the method just described.

To read the source data region of the multilevel memory cell 600, the first sensing voltage $V_{g1}$ 631 may be applied to the gate 615 of the multilevel memory cell 600 and the output 655 of the sensing amplifier 650 observed. If the output 655 is positive, then it may be concluded that the source current 625 exceeds the reference current 639 and that the source data region is programmed to a '11' memory state. If the output 655 is zero, then the second sensing voltage $V_{g2}$ 632 may be applied to the gate 615 and the output 655 of the sensing amplifier 650 again observed. If the output 655 is positive, then a decision may be made that the source data region is programmed to a '10' memory state. If the output 655 is zero, then the third sensing voltage $V_{g3}$ 633 may be applied to the gate 615 and the output 655 observed yet again. A positive value of the output 655 indicates that the source data region is programmed to a '01' memory state. If the output 655 is zero, then the source data region is programmed to a '00' memory state.

Figure 12A:
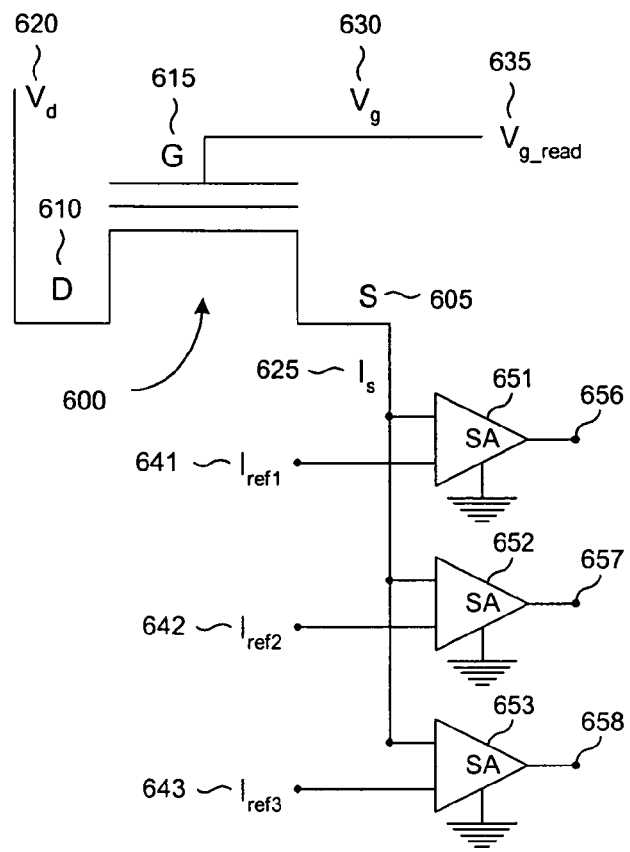
FIG. 12A is a schematic diagram depicting a parallel sensing method that may be used to read/verify a multilevel memory cell.
Figure 12B:
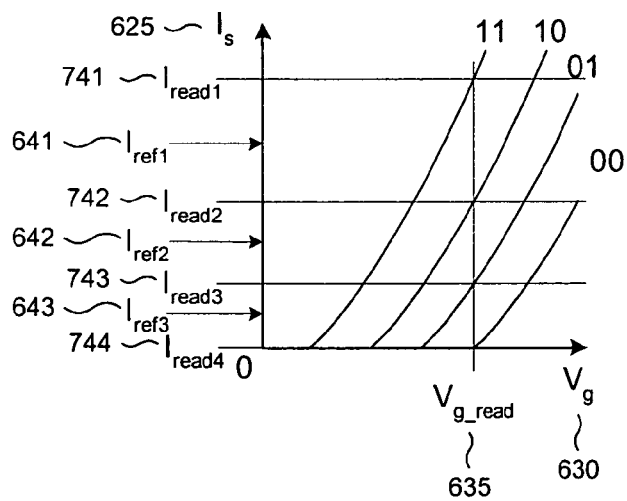
FIG. 12B is a chart illustrating relative voltages and currents according to the parallel sensing method depicted in FIG. 12A.
Figure 13B:
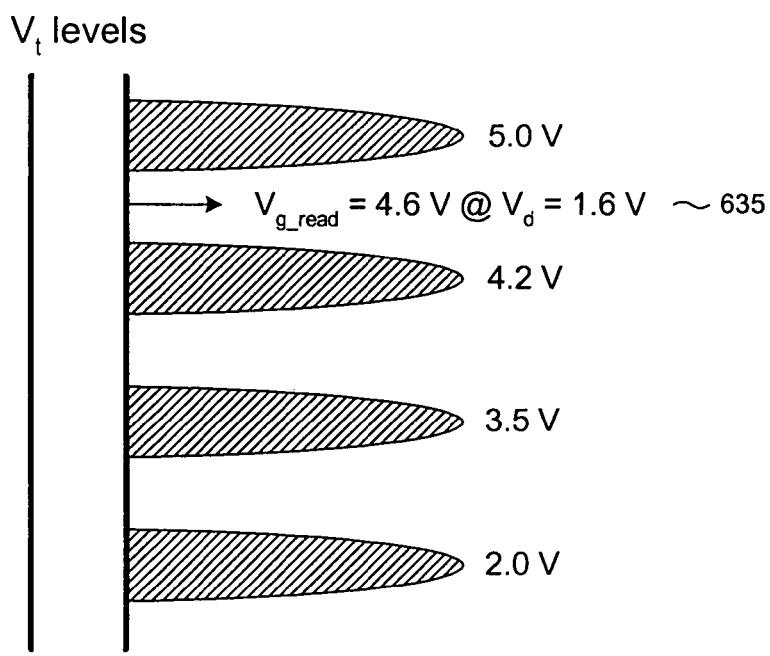
FIG. 13B is a chart depicting a single sensing voltage associated with the parallel sensing method shown in FIGS. 12A and 12B.

FIG. 12A is a schematic diagram illustrating an alternative method that may be employed to read a data region of a multilevel memory cell. This alternative method employs multiple sensing amplifiers and hence may be referred to as a parallel sensing method. In the context of an example of the method, the multilevel memory cell 600 already considered in FIG. 11A is shown in FIG. 12A. The source data region of the multilevel memory cell 600 again is programmed according to PV levels of 5.0, 4.2, 3.5, and 2.0 V corresponding, respectively, to memory states '00', '01', '10', and '11'. As with the serial sensing method, a small positive voltage 620, typically about 1.6 V, may be applied to the drain 610. Whereas a single sensing amplifier 650 and multiple sensing voltages 631, 632, and 633 were employed in the serial sensing method associated with FIG. 11A, an implementation of the parallel sensing method of FIG. 12A uses multiple sensing amplifiers 651, 652, and 653 and a single sensing voltage $V_{g\_read}$ 635. Values for reference currents 641, 642, and 643 for each of the respective sensing amplifiers 651, 652, and 653 may be chosen according to a chart shown in FIG. 12B. The chart in FIG. 12B illustrates dependence of source current 625 upon memory state and gate voltage 630. Specifically, applying a single sensing voltage $V_{g\_read}$ 635 to the gate 615 of the multilevel memory cell 600 results in a value of source current 625 varying with the memory state of the source data region according to the chart of FIG. 12B. Reference currents 641, 642, and 643 may be selected corresponding to values of the source current 625 associated with each memory state. The three sensing amplifiers 651, 652, and 653 illustrated in FIG. 12A may provide outputs according to the memory state of the source data region when the sensing voltage $V_{g\_read}$ 635 is applied. For example, applying sensing voltage $V_{g\_read}$ 635 may result in the source current 625 having a value of $I_{read1}$ 741 that is greater than reference current 641. Accordingly, all three outputs 656, 657, and 658 of the corresponding sensing amplifiers 651, 652, and 653 may be positive, indicating that the source data region of the multilevel memory cell 600 is programmed to a '11' memory state. Continuing, applying sensing voltage $V_{g\_read}$ 635 may produce a source current 625 equal to $I_{read2}$ 742 that is greater than reference current 642 but less than reference current 641. In that instance, output 656 is zero and outputs 657 and 678 are positive, and it may be decided that the source data region of the multilevel memory cell 600 is programmed to a '10' memory state. Similarly, with the same $V_{g\_read}$ 635 applied, the source current 625 may equal $I_{read3}$ 743 having a value greater than reference current 643 but less than reference current 642 so that outputs 656 and 657 are zero and output 658 is positive. A decision corresponding to a '01' memory state may be made in that case. If none of the sensing amplifiers 651, 652, and 653 has an output that is positive, then the memory state of the source data region may be decided to be '00'. A chart shown in FIG. 13B depicts a nominal value of the sensing voltage $V_{g\_read}$ 635 associated with the sensing method illustrated in FIGS. 12A and 12B.

In view of the foregoing, it will be understood by those skilled in the art that the methods of the present invention can facilitate programming of read-only memory devices, and in particular programming multilevel memory cells exhibiting dual bit cell structures, in an integrated circuit. The above-described embodiments have been provided by way of example, and the present invention is not limited to these examples. For example, a data region of a multilevel memory cell may be programmed to different numbers of PV levels, such as two or three, than illustrated here. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A method of programming a multilevel read-only memory cell, comprising:
   providing a multilevel read-only memory cell having a plurality of data regions;
   defining a plurality of memory states for each data region in the multilevel read-only memory cell;
   associating a program verify level with each memory state; and
   dynamically generating a pre-program verify level for each memory state, using the associated program verify levels.

2. The method as set forth in claim 1, further comprising:
   programming at least one of the plurality of data regions; and
   verifying the programming, using at least one of the pre-program verify levels.

3. The method as set forth in claim 1, wherein the dynamic generation of a pre-program verify level comprises:
   establishing an over-program budget (OB) value corresponding to each memory state; and
   establishing a second-bit effect budget (SB) value corresponding to each memory state.

4. The method as set forth in claim 3, wherein the providing of a multilevel read-only memory cell comprises providing a multilevel read-only memory cell having a left data region and a right data region.

5. The method as set forth in claim 4, further comprising:
   programming at least one of the left data region and the right data region; and
   verifying the programming, using at least one of the pre-program verify levels.

6. The method as set forth in claim 4, further comprising:
   selecting a left memory state for the left data region;
   selecting a right memory state for the right data region;
   determining a left OB value according to the left memory state;
   determining a right SB value according to the right memory state; and
   generating a left pre-program verify level according to the left OB value, the right SB value, and the program verity level associated with the left memory state.

7. The method as set forth in claim 6, further comprising:
   determining a right OB value according to the right memory state;
   determining a left SB value according to the left memory state; and
   generating a right pre-program verify level according to the right OB value, the left SB value, and the program verify level associated with the right memory state.

8. The method as set forth in claim 7, further comprising:
   programming at least one of the left data region and the right data region; and
   verifying the programming, using at least one of the left pre-program verify level and the right pre-program verify level.

9. The method as set forth in claim 7, wherein the generating of a left pre-program verify level comprises determining a left dynamic adjustment by adding the left OB value and the right SB value.

10. The method as set forth in claim 9, wherein the generating of a right pre-program verify level comprises determining a right dynamic adjustment by adding the tight OB value and the left SB value.

11. The method as set forth in claim 10, wherein the generating of a left pre-program verify level comprises subtracting the left dynamic adjustment from the program verify level associated with the left memory state.

12. The method as set forth in claim 11, wherein the generating of a right pre-program verify level further comprises subtracting the right dynamic adjustment from the program verify level associated with the right memory state.

13. The method as set forth in claim 12, further comprising:
   programming at least one of the left data region and the right data region; and
   verifying the programming, using at least one of the left pre-program verify level and the right pre-program verify level.

14. The method as set forth in claim 10, wherein the generating of a left pre-program verify level further comprises adding the left dynamic adjustment to the program verify level associated with the left memory state.

15. The method as set forth in claim 14, wherein the generating of a right pre-program verify level further comprises adding the right dynamic adjustment to the program verify level associated with the right memory state.

16. The method as set forth in claim 15, further comprising:
   programming at least one of the left data region and the right data region; and
   verifying the programming, using at least one of the left pre-program verify level and the right pre-program verify level.

17. The method as set forth in claim 1, wherein the defining of a plurality off memory states comprises defining two memory states for each data region.

18. The method as set forth in claim 1, wherein the defining of a plurality of memory states comprises defining three memory states for each data region.

19. The method as set forth in claim 1, wherein the defining of a plurality of memory states comprises defining at least four memory states for each data region.

20. A method of programming a memory cell having first and second data regions, the method comprising:
   defining a plurality of program verify levels for each data region;
   associating a memory state with each program verify level; and
   generating a pre-program verify level for each memory state in each data region;
   wherein the generating of a pre-program verify level comprises determining an over-program budget (OB)

value for each memory state and determining a second-bit effect budget (SB) value for each memory state.

21. The method as set forth in claim 20, further comprising:
selecting a first memory state for the first data region;
selecting a second memory state for the second data region;
selecting a first program verify level for the first data region according to the first memory state; and
generating a first pre-program verify level for the first data region according to the first program verify level, the OB value for the first memory state, and the SB value for the second memory state.

22. The method as set forth in claim 21, further comprising:
selecting a second program verity level for the second data region according to the second memory state; and
generating a second pre-program verify level for the second data region according to the second program verify level, the OB value for the second memory state, and the SB value for the first memory state.

23. The method as set forth in claim 22, further comprising:
programming at least one of the first data region and the second data region; and
verifying the programming, using at least one of the first pre-program verify level and the second pre-program verify level.

24. The method as set forth in claim 22, wherein the generating of a first pre-program verify level for the first data region comprises:
forming a first sum by adding the OB value for the first memory state to the SB value for the second memory state; and
adding the first program verify level to the first sum.

25. The method as set forth in claim 24, wherein the generating of a second pre-program verify level comprises:
forming a second sum by adding the OB value for the second memory state to the SB value for the first memory state; and
adding the second program verify level to the second sum.

26. The method as set forth in claim 25, further comprising:
programming at least one of the first data region and the second data region; and
verifying the programming, using at least one of the first pre-program verify level and the second pre-program verify level.

27. The method as set forth in claim 22, wherein the generating of a first pre-program verify level for the first data region comprises:
forming a first sum by adding the OB value for the first memory state to the SB value for the second memory state; and
subtracting the first sum from the first program verify level.

28. The method as set forth in claim 27, wherein the generating of a second pre-program verify level comprises:
forming a second sum by adding the OB value for the second memory state to the SB value for the first memory state; and
subtracting the second sum from the second program verify level.

29. The method as set forth in claim 28, further comprising:
programming at least one of the first data region and the second data region; and
verifying the programming, using at least one of the first pre-program verify level and the second pre-program verify level.

* * * * *